United States Patent [19]

Yui et al.

[11] Patent Number: 4,987,047
[45] Date of Patent: Jan. 22, 1991

[54] IMAGING SHEET ROLL CONTAINING PHOTOSENSITIVE MICROCAPSULES

[75] Inventors: Yasuji Yui, Kanagawa; Akira Shirakura, Tokyo, both of Japan

[73] Assignee: Sony Corporation, Tokyo, Japan

[21] Appl. No.: 295,384

[22] Filed: Jan. 10, 1989

[30] Foreign Application Priority Data

Jan. 29, 1988 [JP] Japan ............................. 63-10681[U]

[51] Int. Cl.$^5$ ........................... G03C 1/72; G03C 3/02
[52] U.S. Cl. .................................... 430/138; 430/496; 430/500; 430/501; 352/235; 354/275
[58] Field of Search ............... 430/138, 496, 500, 501; 354/275; 352/235

[56] References Cited

U.S. PATENT DOCUMENTS

| | | | |
|---|---|---|---|
| 4,291,966 | 9/1981 | Bendoni et al. | 430/500 |
| 4,423,943 | 1/1984 | Gold | 354/275 |
| 4,782,003 | 11/1988 | Yoshihara | 430/138 |
| 4,788,125 | 11/1988 | Davis et al. | 430/138 |
| 4,833,062 | 5/1989 | Kakimi | 430/138 |

*Primary Examiner*—Hoa Van Le
*Attorney, Agent, or Firm*—Alvin Sinderbrand

[57] ABSTRACT

An imaging sheet roll has a spool on which is wound a film coated with photosensitive microcapsules to form a roll of film between flanges extending radially at the opposite ends of the spool and provide with annular step portions, and a leader tape of a material that is impermeable to light is bonded to the end portion of the film at which the latter unwinds from the spool and has a transverse width greater than that of the film. The leader tape is wound around the annular step portions of the flanges to seat thereagainst and prevent irradiation by light of the photosensitive microcapsules coating the film wound on the spool.

7 Claims, 4 Drawing Sheets

IMAGING SHEET ROLL CONTAINING PHOTOSENSITIVE MICROCAPSULES

RELATED APPLICATIONS

This application is related to copending commonly assigned U.S. patent application Ser. No. 07/248,373, filed Sept. 23, 1988, and Ser. No. 07/271,156, filed Nov. 14, 1988.

BACKGROUND OF THE INVENTION

1. Field of the Invention

The present invention relates to an imaging sheet roll containing a film coated with photosensitive microcapsules.

2. Description of the Prior Art

A printing method has been known to print an image of a color picture on a printing paper by utilizing photosensitive microcapsules. Such a conventional printing method will be first described with reference to FIGS. 1 to 3.

Referring initially to FIG. 1, a photosensitive film 1 is used which comprises a sheet or base 1a made of polyethylene terephthalate, polypropylene, polyamide or the like, and a microcapsule layer 2 which comprises a plurality of yellow, magenta and cyan microcapsules 2Y, 2M and 2C and is uniformly coated on the sheet or base 1a. Each of the yellow, magenta and cyan microcapsules 2Y, 2M and 2C has an outer shell made of a relatively soft material, such as, gelatin, polyvinyl alcohol, gum arabic or the like and a substance containing an optically-hardening composition sealed within each shell. This optically-hardening composition contains a pigment or a precursor thereof, such as photochromic dye, electrochromic dye, leuco dye and the like and an ethylene-based unsaturated compound or the like. When the optically-hardening composition is subject to irradiation with light of a particular wavelength, it is hardened, whereby the yellow, magenta and cyan microcapsules 2Y, 2M and 2C are selectively hardened. For example, irradiation with blue light hardens the yellow microcapsules 2Y containing the precursor of yellow pigment; irradiation with green light hardens the magenta microcapsules 2M containing the precursor of magenta pigment; and irradiation with red light hardens the cyan microcapsules 2C containing the precursor of cyan pigment, respectively.

As shown in FIG. 2, when the described microcapsule sheet 1 is irradiated with the light of a desired color picture, such light is analyzed into the three primary colors of red, green and blue, whereby the red light of the image, the green light of the image and the blue light of the image separately irradiate the photosensitive film whereby the microcapsules are respectively hardened by irradiation with beams of light of the corresponding colors for forming respective images as represented by hatched microcapsules 2a in FIG. 2. Then, the developing-process is performed as shown in FIG. 3.

In such developing process, a developing paper 3 is brought in contact with the microcapsule layer 2 of the film 1 that is already irradiated with the light images. The film 1 and the developing paper 3 are then pinched or pressed between rollers 4a and 4b. Then, the pressure breaks the outer shells of the yellow, magenta and cyan microcapsules 2Y, 2M and 2C that are not hardened by the irradiation of light having a corresponding wavelength, thus transferring the substances containing precursors of pigments from within the microcapsules to the surface of the developing paper 3. When the precursors of pigments of the respective colors are transferred to this developing paper 3, the surface of the developing paper 3 is developed with the corresponding colors (yellow, magenta and cyan). The mixing of these three colors presents a color picture which is developed (or printed) on the developing paper 3.

In the prior art, the long photosensitive film 1 is wound in the form of a roll around a spool located rotatably within a cassette casing that is arranged to shield the film from light coming from the outside. In use, this long photosensitive film 1 is loaded on a cassette loading portion of a printer while the film is kept within the cassette casing.

This kind of conventional photosensitive film cassette 7 is shown in FIG. 4 to comprise a cassette casing 5 of substantially cylindrical configuration, a spool 6 rotatably provided within the cassette casing 5 and around which the long photosensitive film 1 is wound, a film outlet 8 of substantially slit configuration extending through the outer peripheral portion of the cassette casing 5 along the axial direction of the cassette casing 5 and pads 9, 9 attached to the two inner side walls of the film outlet 8 along the longitudinal direction of the film outlet 8 to shield the film from light from the outside. The free end portion of the photosensitive film 1 is widthdrawn through the spacing between the opposing surfaces of the light-shielding pads 9, 9 and advanced from the film outlet 8 to the outside of the cassette casing 5. If the photosensitive film 1 is pinched firmly between the pads 9, 9 so that the photosensitive film 1 can be perfectly protected from being irradiated with light at the film outlet 8, the photosensitive film 1 shown in FIGS. 1 to 3 is inevitably rubbed by the pads 9, 9 with a very large friction force during its feeding from the cassette casing 5 with the result that the photosensitive film 1 is scratched and damaged by the pads 9 and 9, and at least some of the microcapsules are broken.

On the other hand, if the pads 9, 9 are arranged to contact the phtosensitive film 1 with only a small pressure in order to protect the photosensitive film 1 from being damaged as much as possible, the light-shielding effect at the film outlet 8 is lowered.

To solve such a problem the assignee of the present application has previously prosposed a photosensitive film cassette as shown in FIG. 5 (and as disclosed in Japanese Patent Application No. 62-140913). In FIG. 5 parts corresponding to those of FIG. 4 are identified by the same references and will not be again described in detail.

FIG. 5 shows the photosensitive film cassette 7 within which the photosensitive film 1 is wound around the spool 6 in the form of a roll of film. The film outlet 8 is formed through the cassette casing 5 to permit the photosensitive film 1 to be withdrawn therethrough. Further, the photosensitive film cassette 7 is provided with a light-shielding member 10 which is pivotably supported by the cassette casing 5 for movement toward and away from one inner side surface of the film outlet 8 to thereby close the film outlet 8, spring biasing means (not shown, are provided for always spring-biasing the light-shielding member 10 such that the light-shielding member 10 closes the film outlet 8. An actuating portion (not shown) on the member 10 is pressed by a pressing portion of a predetermined cassette loading portion so as to move the light-shielding member 10 away from the inner side surface of the film outlet 8 when the photosensitive film cassette 7 is loaded on the cassette loading portion. Reference numerals 11, 11 designate flanges that are engaged with both ends of the cassette casing 5 to rotatably support the spool 6.

When the photosensitive film cassette 7 is not loaded on the predetermined cassette loading portion, the light-shielding member 10 resiliently contacts with the one inner side surface of the film outlet 8 with the photosensitive film 1 being gripped therebetween so that light-shielding of the photosensitive film 1 at the film outlet 8 can be positively effected. Also, this light-shielding state can be maintained stably. Further, when the photosensitive film cassette 7 is loaded on the predetermined cassette loading portion, the light-shielding member 10 is spaced apart from the inner side surface of the film outlet 8 so that the photosensitive film 1 can be freely advanced through such outlet and is prevented from being damaged by the light-shielding member 10 in its advancement from the cassette casing 5. In addition, when the photosensitive film cassette 7 is loaded on the film cassette loading portion, the light-shielding member 10 is automatically spaced apart from the inner side surface of the film outlet 8 without the need for any special operation to be perfomed by the user.

However, with the arrangement shown in FIGS. 4 and 5, the photosensitive film cassette 7 needs not only the cassette casing 5 but also the light-shielding pads 9, 9 or the light-shielding member 10, respectively for shielding the light. Moreover, the photosensitive film cassette 7 needs a relatively complex built-in mechanism when the light-shielding member 10 is employed. This increases the cost of the photosensitive film cassette 7 which is thereby unsuited for use as product on the market.

OBJECTS AND SUMMARY OF THE INVENTION

Accordingly, it is an object of the present invention to provide an improved imaging sheet roll containing photosensitive microcapsules and which can avoid the above-mentioned problems encountered with the prior art.

It is another object of the present invention to provide an imaging sheet roll containing a photosensitive film with microcapsules, and which provides a simple arrangement to protect the photosensitive film from irradiation by light without using a cassette casing.

It is still another object of the present invention to provide an imaging sheet roll containing photosensitive microcapsules, as aforesaid, and which can be produced at low cost.

It is a further object of the present invention to provide an imaging sheet roll containing photosensitive microcapsules and that can be economically discarded after use.

It is a still further object of the present invention to provide an imaging sheet roll containing photosensitive microcapsules which is easy to handle.

Accordingly to an aspect of the present invention, there is provided an imaging sheet roll comprising: a spool;

a photosensitive film having a coating thereon of photosensitive microcapsules and being wound on the spool in the form of a roll;

flanges extending radially outward from the opposite ends of said spool;

a leader tape portion made of a light impervious material bonded to said photosensitive film at its end portion at which said photosensitive film begins to unwind; and annular step portions formed on radially outer portions of the flanges and in which said leader tape portion is wound to shield said photosensitive film from light.

BRIEF DESCRIPTION OF THE DRAWINGS

A better understanding of the objects, features and advantages of the invention can be gained from a consideration of the following detailed description of the preferred embodiments thereof, when read in conjunction with the accompanying drawings, wherein.

DETAILED DESCRIPTION OF THE PREFERRED EMBODIMENTS

An imaging sheet roll having a base coated with photosensitive microcapsules which are protected from inadvertent exposure according to an embodiment of the present invention will now be described in detail with reference to FIGS. 6 and 7.

Figure 5:
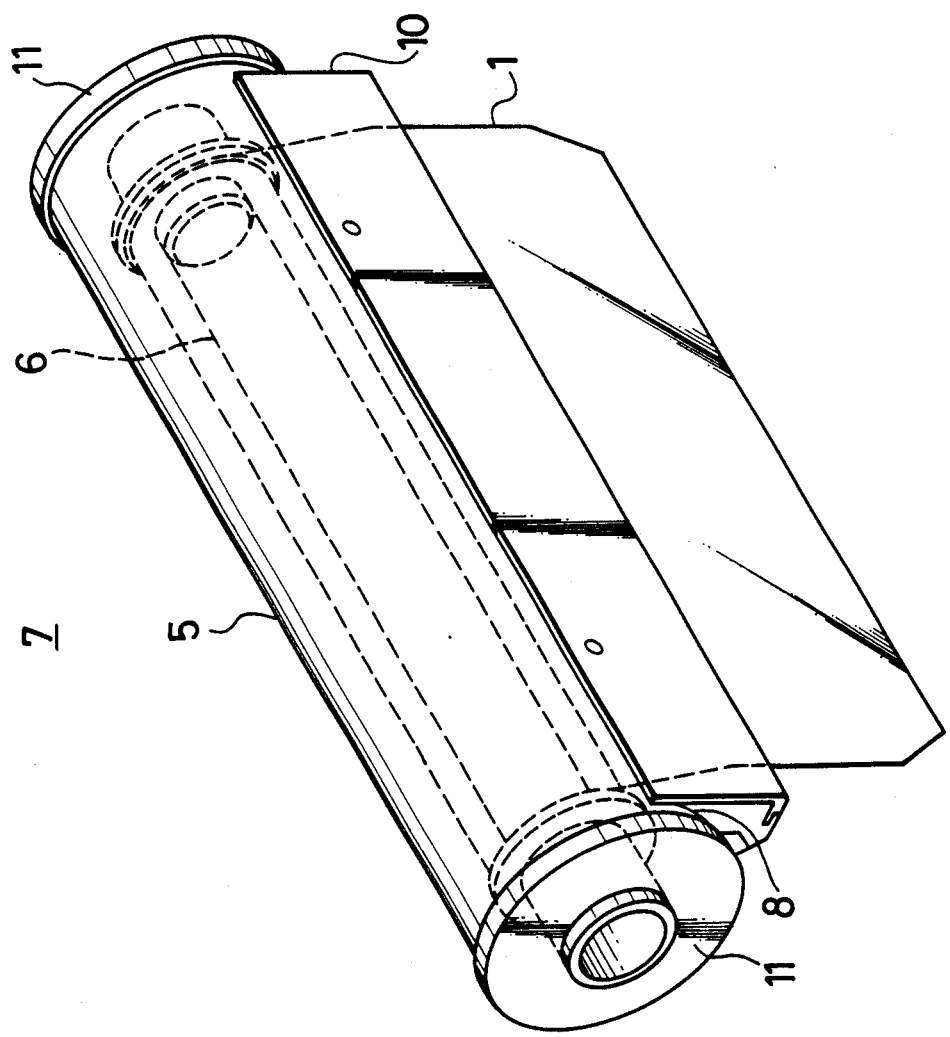
FIG. 5 is a perspective view of another example of conventional photosensitive film cassette.
Figure 4:
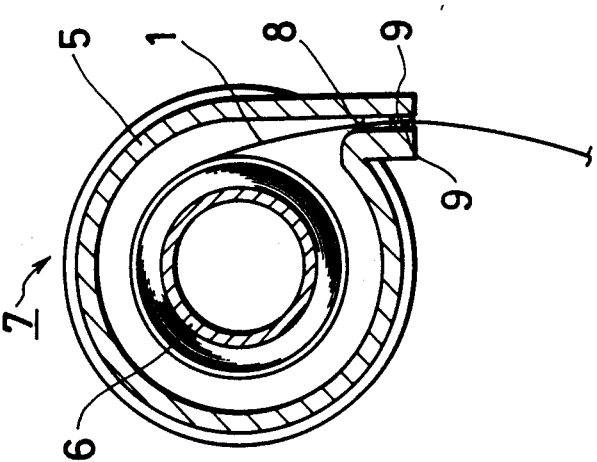
FIG. 4 is a cross-sectional side view of an example of a conventional photosensitive film cassette.
Figure 6:
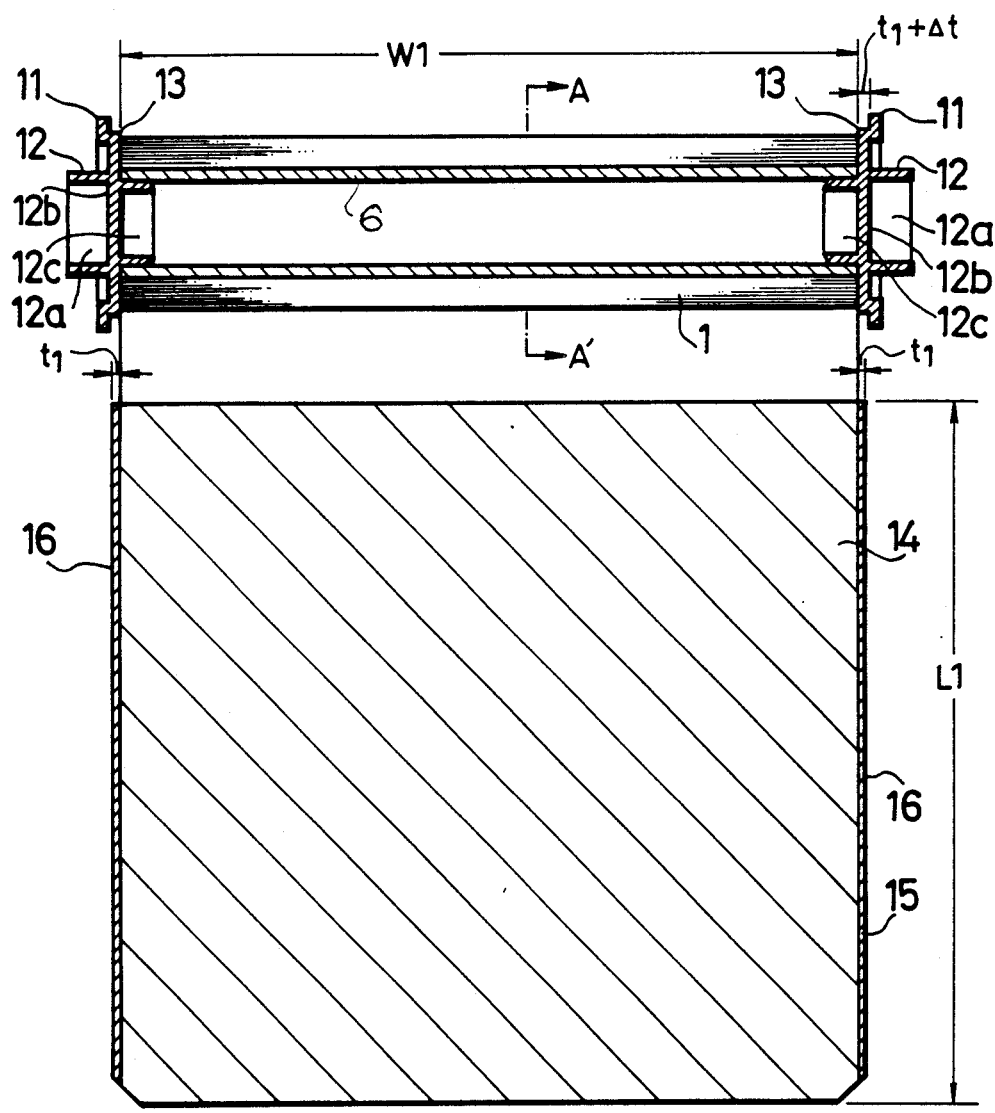
FIG. 6 is an axial sectional view of an imaging sheet roll having a base coated with photosensitive microcapsules protected from inadvertent exposure according to an embodiment of the present invention and which is shown partly unwound.
Figure 7:
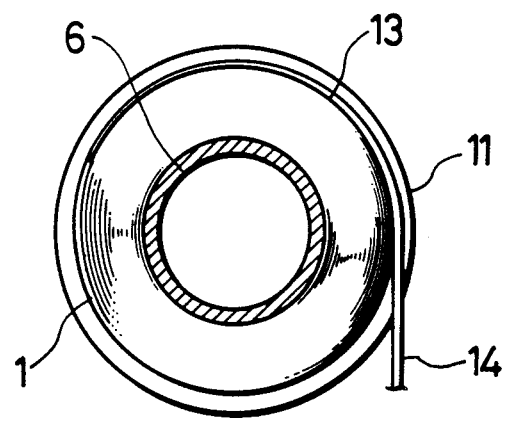
FIG. 7 is a cross-sectional view of the imaging sheet roll shown in FIG. 6 as viewed in the direction of the arrows A A' in FIG. 6.

In FIGS. 6 and 7, parts corresponding to those of FIGS. 4 and 5 are identified with the same reference numerals and further explanation thereof will be omitted.

Figure 1:
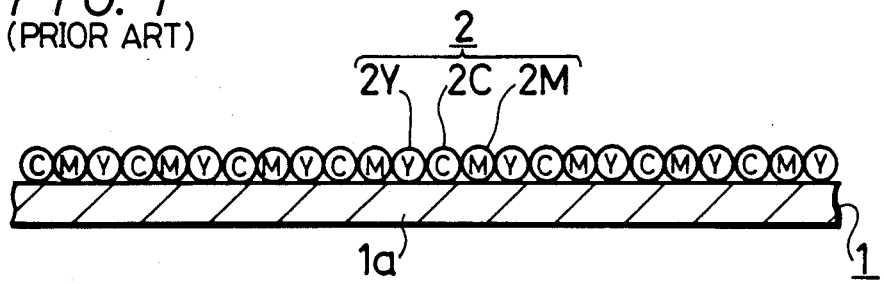
FIG. 1 is a schematic diagram showing a conventional photosensitive film of the type having a base with photosensitive microcapsules coated thereon.
Figure 2:
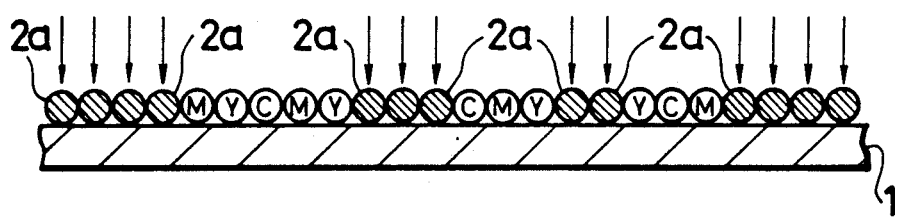
FIG. 2 is a schematic diagram showing the exposed state of the conventional photosensitive film.
Figure 3:
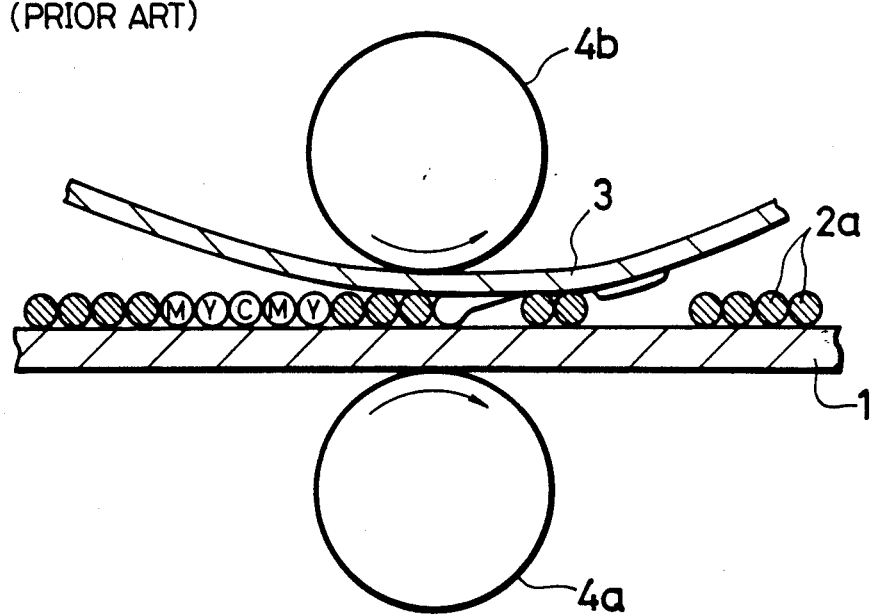
FIG. 3 is a schematic diagram showing a printing operation with the conventional photosensitive film.

In the embodiment of FIGS. 6 and 7, the spool 6 is made of a synthetic resin or cardboard and is of a hollow configuration. End caps 12, 12 having radially directed flanges 11, 11 extending outwardly therefrom are secured to the opposite end of the spool 6. Each of the caps 12 comprises, at the opposite sides of the respective flange 11, a hollow, axially inward protrusion 12c to be inserted into and fixed to the adjacent hollow end portion of the spool 6 and a hollow bearing or socket portion 12a protruding axially outward to be engaged with a respective shaft of a printing apparatus (not shown). If necessary, the hollow portion between the protrusions 12a and 12c is closed by a wall 12b. On each flange 11, there is provided an annular step portion 13 which is offset axially outward toward the bearing or socket portion 12a by a width, $t_1 + t$ from the inner surface of the respective flange 11. The spool 6 and the caps 12, 12 with the flanges 11, 11 may be molded as one body of a suitable material such as a synthetic resin or the like. The spool 6 has the photosensitive film 1 wound therearound in the form of a roll of film. The width of the photosensitive film 1 is selected to be nearly equal to a width W1 between the flanges 11 and 11. The photosensitive film 1 is similar to that described before in connection with FIGS. 1 to 3. The outer end portion or supply-starting portion of the photosensitive film 1 is bonded with a so-called leader tape 14 made of a material such as a black paper, an aluminum-deposited tape or the like that is impervious to the passage of light by either absorbing or reflecting the same to form a leader portion 15. The leader tape 14 has a width which is larger than the width W1 of the photosensitive film 1 by the width $t_1$ at each of the opposite side edges of the leader portion 15. In other words, the width of the leader tape 14 is $W1+2t_1$. The length L1 of the leader tape 14 is selected so that the leader tape 14 can be wound several times around the step portions 13 after the photosensitive film 1 has been wound around the spool 6 to have an outer diameter just under the step portions 13, 13 of the flanges 11, 11 whereupon the imaging sheet roll according to the present invention can be properly loaded on the printer body (not shown). Further, the leader tape 14 is desirably coated with adhesive bonded agents 16 at each of its side edge portions having a width corresponding to the width $t_1$ of each of the step portions 13, 13. Alternatively, the bonding agent 16 might be coated on the step portions 13, 13 of the flanges 11, 11 instead of the leader tape 14. In this case, it is desired that the surface of the step portion 13 is made coarse so that the bonding agent 16 can be readily peeled off therefrom. As still another alternative, the bonding agent 16 may be omitted.

After the photosensitive film 1 is wound around the spool 6 up to the position of the step portions 13, 13 of the flanges 11, 11, the wider leader tape 14 is also wound around the spool 6 so as to be wrapped about the step portions 13, 13 of the flanges 11, 11. Thus, the leader tape 14 wound on the step portions 13, 13 is bonded to itself owing to the action of the bonding agent 16. As a result, no light reaches through the spaces between the end faces of the flanges 11, 11 and the end faces of the wound photosensitive film 1 since the imaging sheet roll containing photosensitive microcapsules in accordance with the invention is constructed as described above, this imaging sheet roll microcapsules of the microcapsules of the does not need a cassette casing and can be made very inexpensively. Thus, the imaging sheet roll containing photosensitive microcapsules of the invention can be disposable after use.

Figure 8:
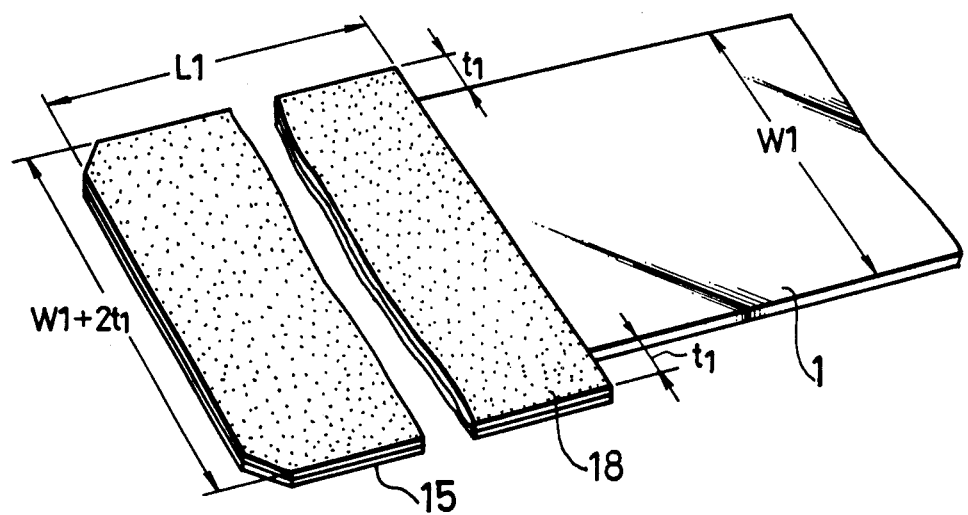
FIG. 8 is a perspective view of another embodiment of the photosensitive film according to the present invention.

While the leader tape 14 is bonded to the outer end portion of photosensitive film 1 as described above, it is also possible, as shown in FIG. 8 that the outer end portion of the photosensitive film 1 is itself formed wider than the balance of the photosensitive film, and on a portion of the film intended to form the leader portion 15, there is coated black paint 18 which is impervious to light.

According to the present invention, since the photosensitive film can be shielded from the light by the leader portion of the leader tape or the like without a large cassette casing, the imaging sheet roll containing photosensitive microcapsules according to the invention can be miniaturized and can be made inexpensive. Further, the imaging sheet roll containing photosensitive microcapsules of the invention can be disposable and easy to handle.

It should be understood that although preferred embodiments of the invention are described in detail above, it will be apparent that the invention is not limited thereto, and that many modifications and variations thereof could be effected by one with ordinary skill in the art without departing from the spirit and scope of the novel concepts of the invention as defined by the appended claims.

We claim as our invention:

1. An imaging sheet roll comprising:
   a photosensitive film of a predetermined width and having a coating of photosensitive microcapsules;
   a spool for winding therearound said photosensitive film in the form of a roll;
   flange portions extending radially outward at the opposite ends of said spool with an axial distance between confronting surfaces of said flange portions being as large as said width of the film for guiding the latter in said roll on the spool;
   a leader tape portion of a material which is impervious to the passage of light therethrough and is bonded to said photosensitive film at its end portion at which said photosensitive film begins to be unwound from said roll thereof on said spool, said leader tape portion having a width larger than said axial distance between said confronting surfaces of the flange portions; and said leader tape portion being coated with an adhesive bonding agent on its opposite side edges
   annular step portions formed on radially outer regions of said flange portions and extending axially away from each other relative to said confronting surfaces so that lateral edge portions of said leader tape portion of said photosensitive film are wound on said annular step portions for shielding said roll of the photosenstive film from light.

2. An imaging sheet roll as claimed in claim 1, in which said spool is of a hollow configuration and each of said flange portions is provided on a hollow cap engaged with a respective end of said spool.

3. An imaging sheet roll as claimed in claim 2, in which each of said caps has, at one side, a hollow protrusion inserted into the adjacent end of said hollow spool and, at its other side, a bearing portion extended in an axial direction opposite to said hollow protrusion.

4. An imaging sheet roll as claimed in claim 3, in which each of said caps has a blind wall therein between said hollow protrusion and said bearing portion.

5. An imaging sheet roll according to claim 1, in which said material forming said leader tape portion is selected from the group consisting of black paper and an aluminum-deposited tape.

6. An imaging sheet roll according to claim 1, in which each of said annular step portions has a radially outwardly directed terminating surface and in which said width of said leader portion is substantially the same as an axial distance between said terminating surfaces.

7. An imaging sheet roll as claimed in claim 1, in which said leader tape portion is formed of black paint coated on said end portion of said photosensitive film at which the latter begins to be unwound.

* * * * *